(12) United States Patent
Yen et al.

(10) Patent No.: US 12,368,425 B2
(45) Date of Patent: Jul. 22, 2025

(54) METHOD FOR MANUFACTURING FILM BULK ACOUSTIC RESONANCE DEVICE HAVING SPECIFIC RESONANT FREQUENCY

(71) Applicant: Taiwan Carbon Nano Technology Corporation, Miaoli County (TW)

(72) Inventors: Tsung Fu Yen, Miaoli County (TW); Kuang-Jui Chang, Miaoli County (TW); Chiun-Shian Tsai, Miaoli County (TW); Ting-Chuan Lee, Miaoli County (TW); Chiun-Rung Tsai, Miaoli County (TW)

(73) Assignee: Taiwan Carbon Nano Technology Corporation, Miaoli County (TW)

( * ) Notice: Subject to any disclaimer, the term of this patent is extended or adjusted under 35 U.S.C. 154(b) by 577 days.

(21) Appl. No.: 17/506,909

(22) Filed: Oct. 21, 2021

(65) Prior Publication Data
US 2022/0131513 A1      Apr. 28, 2022

(30) Foreign Application Priority Data
Oct. 22, 2020   (TW) ................................. 109136755

(51) Int. Cl.
| | | |
|---|---|---|
| *H03H 3/02* | (2006.01) | |
| *H03H 9/02* | (2006.01) | |
| *H03H 9/13* | (2006.01) | |
| *H03H 9/17* | (2006.01) | |

(52) U.S. Cl.
CPC .......... *H03H 3/02* (2013.01); *H03H 9/02015* (2013.01); *H03H 9/131* (2013.01); *H03H 9/173* (2013.01); *H03H 2003/021* (2013.01)

(58) Field of Classification Search
CPC ...... H03H 3/02; H03H 9/02015; H03H 9/131; H03H 9/17; H03H 9/173; H03H 3/04; H03H 2003/021; H03H 2003/023; H10N 30/88; Y10T 29/49005
See application file for complete search history.

(56) References Cited

U.S. PATENT DOCUMENTS

| | | | | |
|---|---|---|---|---|
| 7,592,739 | B2* | 9/2009 | Robert .................... | H03H 9/173 310/330 |
| 7,745,975 | B2* | 6/2010 | Asai ......................... | H03H 3/04 367/68 |
| 8,487,719 | B2* | 7/2013 | Jansman ............ | H03H 9/02118 29/25.35 |
| 9,490,418 | B2* | 11/2016 | Burak .................... | H10N 30/88 |

(Continued)

*Primary Examiner* — Donghai D Nguyen
(74) *Attorney, Agent, or Firm* — HEA Law PLLC; Darrin A. Auito

(57) ABSTRACT

A method for manufacturing a film bulk acoustic resonance device is disclosed. The proposed method, wherein the device has a specific resonant frequency, includes: providing a substrate having a recess, wherein the recess has a height; configuring a first piezoelectric material layer on the substrate, and causing the recess to form an air gap; configuring a lower electrode on the first piezoelectric material layer; when the height is in a first range, causing a resonant frequency of the film bulk acoustic resonance device versus the height to have a first slope; when the height is in a second range, causing the resonant frequency versus the height to have a second slope; and causing the first slope to be smaller than the second slope.

6 Claims, 2 Drawing Sheets

(56) References Cited

U.S. PATENT DOCUMENTS

2007/0057599 A1\* 3/2007 Motai .................... H03H 9/173
                                                          310/324
2018/0085787 A1\* 3/2018 Burak ................ H03H 9/02118

\* cited by examiner

METHOD FOR MANUFACTURING FILM BULK ACOUSTIC RESONANCE DEVICE HAVING SPECIFIC RESONANT FREQUENCY

CROSS-REFERENCE TO RELATED APPLICATION

The application claims the benefit of Taiwan Patent Application No. 109136755, filed on Oct. 22, 2020, at the Taiwan Intellectual Property Office, the disclosures of which are incorporated herein in their entirety by reference.

TECHNICAL FIELD

The present disclosure is related to a semiconductor technique applied to a MEMS. Particularly, the present disclosure is applied to a MEMS used in a sensor and an energy-related device.

BACKGROUND

The existing sensor technologies include pure mechanical sensors, CMOS sensors, MEMS sensors etc. However, the sensitivities of the above-mentioned sensors cannot fulfill requirements for detection of VOC gases of human beings such as via a portable device, e.g., a mobile phone. But, a film bulk acoustic resonance (FBAR) device having PZT can do this.

How to improve the existing FBAR technologies to let them have a better efficiency and/or a simpler structure, or a lower manufacturing cost is worthy of further research and improvement.

Keeping the drawbacks of the prior art in mind, and through the use of robust and persistent experiments and research, the applicant has finally conceived of a method for manufacturing a film bulk acoustic resonance device having a specific resonant frequency.

SUMMARY

It is an objective of the present invention to provide a method for manufacturing a film bulk acoustic resonance device having a specific resonant frequency, comprising: providing a substrate having a recess having a height; configuring a first piezoelectric material layer on the substrate, and causing the recess to form an air gap; configuring a lower electrode on the first piezoelectric material layer; causing the specific resonant frequency versus the height to have a first slope when the height is in a first range; causing the specific resonant frequency versus the height to have a second slope when the height is in a second range; and causing the first slope to be smaller than the second slope. FBAR devices respectively having air gaps with various depths (heights) and manufactured via that method will respectively generate various resonant frequencies. Multiple FBAR devices having various heights of the air gaps can be used to simultaneously detect various VOC gases via multi-frequency control, and the same wafer can include a plurality of FBAR devices respectively having various heights of the air gaps to decrease the manufacturing costs.

In accordance with the first aspect of the present invention, a method for manufacturing a film bulk acoustic resonance device having a specific resonant frequency comprises: providing a substrate having a recess, wherein the recess has a height; configuring a first piezoelectric material layer on the substrate; causing the recess to form an air gap; configuring a lower electrode on the first piezoelectric material layer; obtaining a functional relation of a resonant frequency of the film bulk acoustic resonance device versus the height, wherein when the height is in a first range, the functional relation is defined by a first slope, when the height is in a second range, the functional relation is defined by a second slope, and the second slope is larger than the first slope; and depending on a specific height of the recess which corresponds to the specific resonant frequency, selecting the specific height to manufacture the film bulk acoustic resonance device.

In accordance with the second aspect of the present disclosure, a method for manufacturing a film bulk acoustic resonance device having a specific resonant frequency comprises: providing a substrate having a recess having a height; configuring a first piezoelectric material layer on the substrate, and causing the recess to form an air gap; configuring a lower electrode on the first piezoelectric material layer; causing the specific resonant frequency versus the height to have a first slope when the height is in a first range; causing the specific resonant frequency versus the height to have a second slope when the height is in a second range; and causing the first slope to be smaller than the second slope.

BRIEF DESCRIPTION OF THE DRAWINGS

Other objectives, advantages and efficacies of the present disclosure will be described in detail below taken from the preferred embodiments with reference to the accompanying drawings.

DETAILED DESCRIPTION

Figure 1:
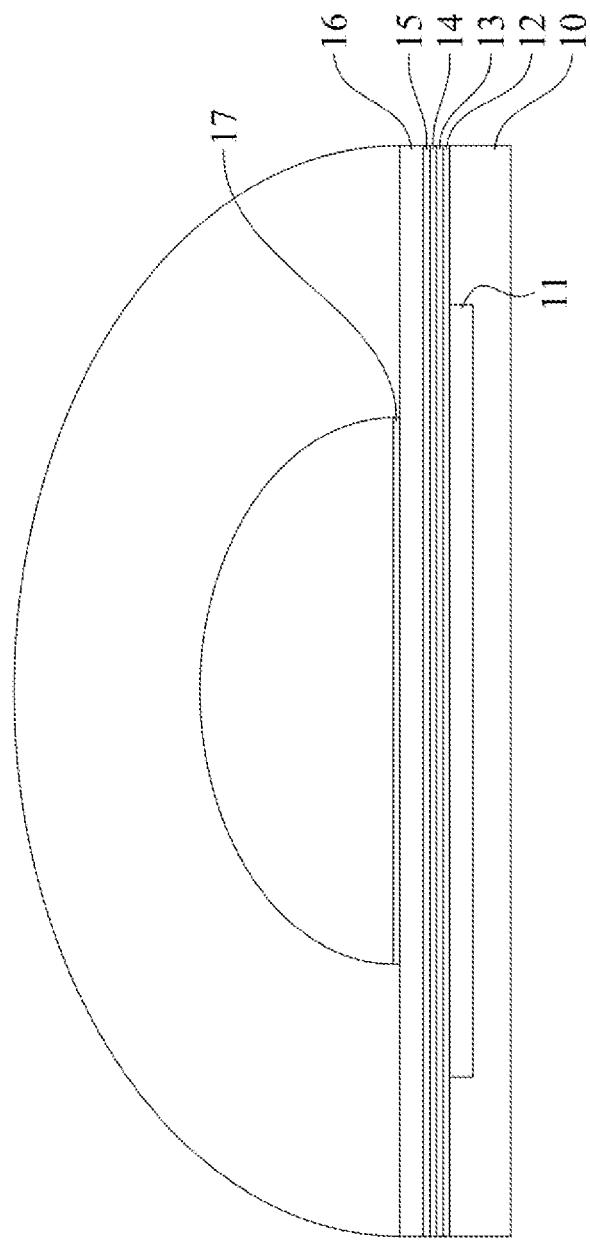
FIG. 1 shows a cross-section diagram of a FBAR device according to the preferred embodiment of the present disclosure.

FIG. 1 is a cross-section diagram of a FBAR device according to the preferred embodiment of the present disclosure. In FIG. 1, a FBAR device 1 includes a substrate 10, a first insulating layer 12, a second insulating layer 13, a first piezoelectric material layer 14, a lower electrode 15, a second piezoelectric material layer (it is a piezoelectric material film) 16 and an upper electrode 17, wherein the first insulating layer 12 is configured on the substrate 10, the second insulating layer 13 is configured on the first insulating layer 12, the first piezoelectric material layer 14 is configured on the second insulating layer 13, the lower electrode 15 is configured on the first piezoelectric material layer 14, the second piezoelectric material layer 16 is configured on the lower electrode 15, and the upper electrode 17 is configured on the second piezoelectric material layer 16. In addition, there is an air gap 11 between the first insulating layer 12 and the substrate 10, and the air gap is vacuumized to exhibit a vacuum state.

As shown in FIG. 1, the substrate 10 includes a silicon (Si), the first insulating layer 12 includes a silicon nitride (SiN), the second insulating layer 13 includes a silicon dioxide ($SiO_2$), the upper electrode 17 and the lower electrode 15 include Mo, the first piezoelectric material layer 14 and the second piezoelectric material layer 16 include aluminum nitride (AlN) or lead zirconium titanate (PZT).

In FIG. 1, a depth (height) of the air gap 11 is e.g., 1 μm (the first preferred embodiment), 3 μm (the second preferred embodiment), or 5 µm (the third preferred embodiment). Thicknesses of the first insulating layer 12, the second insulating layer 13, the first piezoelectric material layer 14, the upper electrode 17 and the lower electrode 15 are all 0.2 µm, and a thickness of the second piezoelectric material layer 16 is 1 µm.

As shown in FIG. 1, the substrate 10, the first insulating layer 12, the second insulating layer 13, the first piezoelectric material layer 14, the lower electrode 15 and the second piezoelectric material layer 16 form a first cylinder, a first diameter of the first cylinder is, e.g., 200 µm, the air gap 11 forms a second cylinder, a second diameter of the second cylinder is, e.g., 140 µm, the upper electrode 17 forms a third cylinder, and a third diameter of the third cylinder is, e.g., 100 µm.

Figure 2:
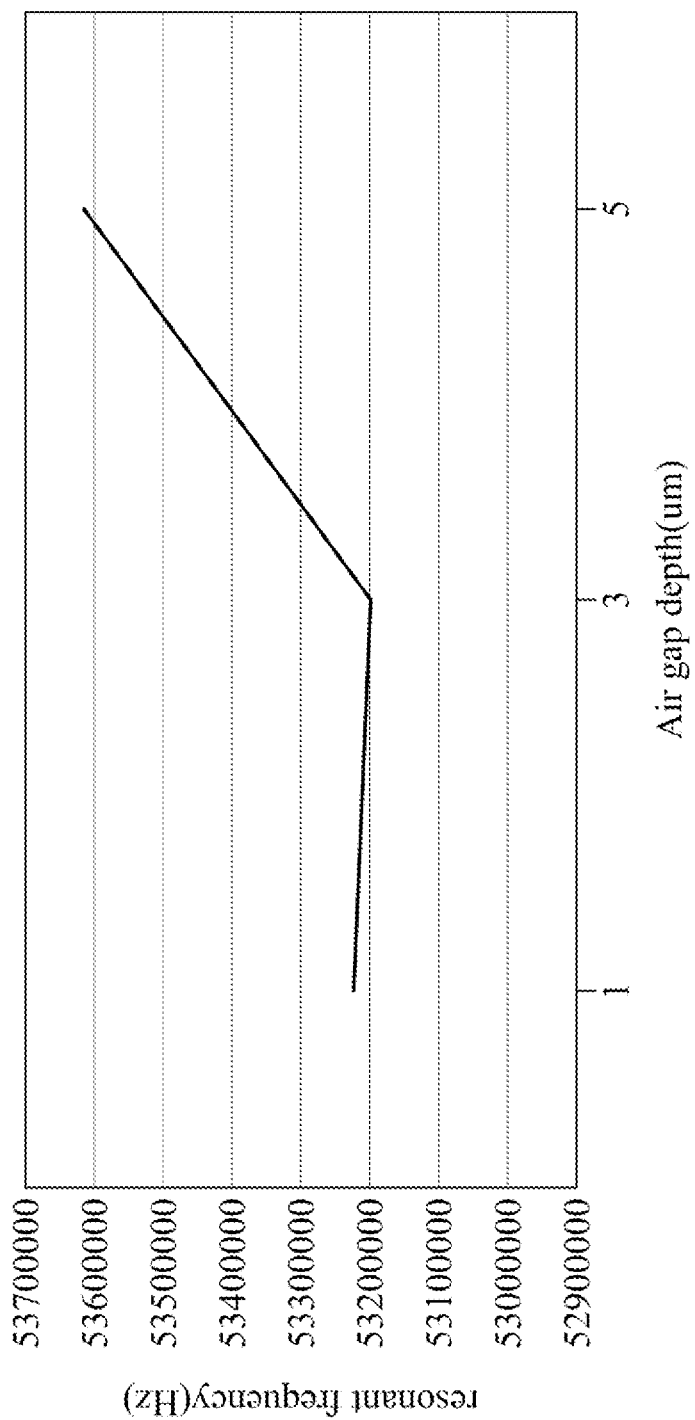
FIG. 2 shows a wave diagram of an air gap depth of a FBAR device versus a resonant frequency of the FBAR device according to the preferred embodiment of the present disclosure.

FIG. 2 is a wave diagram of an air gap depth of a FBAR device versus a resonant frequency of the FBAR device according to the preferred embodiment of the present disclosure.

As shown in FIG. 2, when the depth of the air gap 11 increases from 1 µm to 3 µm, a first decreased difference value of a resonant frequency of the FBAR 1 is about 24 KHz, and when the depth of the air gap 11 increases from 3 µm to 5 µm, a second increased difference value of the resonant frequency of the FBAR 1 is about 418 KHz. That is to say, it can be seen in FIG. 2, when the depth of the air gap 11 is engaged in a linear change (e.g., the depth of the air gap 11 increases from 1 µm to 3 µm, or increases from 3 µm to 5 µm), the resonant frequency of the FBAR 1 presents a non-linear change (e.g., when the depth of the air gap 11 increases from 1 µm to 3 µm, the first decreased difference value of the resonant frequency of the FBAR 1 is about 24 KHz, or when the depth of the air gap 11 increases from 3 µm to 5 µm, the second increased difference value of the resonant frequency of the FBAR 1 is about 418 KHz).

A method for manufacturing a film bulk acoustic resonance device 1 having a specific resonant frequency is proposed according to the fourth preferred embodiment of the present disclosure, and the method comprises: providing a substrate 10 having a recess 11, wherein the recess 11 has a height; configuring a first piezoelectric material layer 14 on the substrate 10, and causing the recess 11 to form an air gap 11; configuring a lower electrode 15 on the first piezoelectric material layer 14; causing the specific resonant frequency versus the height to have a first slope when the height is in a first range; causing the specific resonant frequency versus the height to have a second slope when the height is in a second range; and causing the first slope to be smaller than the second slope.

The above-mentioned method proposed according to the fourth preferred embodiment of the present disclosure further includes: depending on a specific height of the recess 11 which corresponds to the specific resonant frequency, selecting the specific height to manufacture the film bulk acoustic resonance device 1, wherein when a first thickness of the air gap 11 increases from 1 µm to 3 µm, the first decreased difference value of the resonant frequency of the FBAR 1 is about 24 KHz, and when a second thickness of the air gap 11 increases from 3 µm to 5 µm, the second increased difference value of the resonant frequency of the FBAR 1 is about 0.418 MHz.

A method for manufacturing a film bulk acoustic resonance device 1 having a specific resonant frequency is proposed according to the fifth preferred embodiment of the present disclosure, and the method comprises: providing a substrate 10 having a recess 11, wherein the recess 11 has a height; configuring a first piezoelectric material layer 14 on the substrate 10; causing the recess 11 to form an air gap 11; configuring a lower electrode 15 on the first piezoelectric material layer 14 to commonly form a resonant frequency determining structure (10+14+15) of the FBAR device with the substrate 10 and the first piezoelectric material layer 14; causing a resonant frequency of the film bulk acoustic resonance device 1 versus the height to form a functional relation, wherein when the height is in a first range, the functional relation is defined by a first slope, when the height is in a second range, the functional relation is defined by a second slope, and the second slope is larger than the first slope; and depending on a specific height of the recess 11 which corresponds to the specific resonant frequency, selecting the specific height to manufacture the film bulk acoustic resonance device 1.

In conclusion, the present disclosure provides a method for manufacturing a film bulk acoustic resonance device having a specific resonant frequency, comprising: providing a substrate having a recess having a height; configuring a first piezoelectric material layer on the substrate, and causing the recess to form an air gap; configuring a lower electrode on the first piezoelectric material layer; causing the specific resonant frequency versus the height to have a first slope when the height is in a first range; causing the specific resonant frequency versus the height to have a second slope when the height is in a second range; and causing the first slope to be smaller than the second slope. FBAR devices respectively having air gaps with various depths (heights) and manufactured via that method will respectively generate various resonant frequencies. Multiple FBAR devices having various heights of the air gaps can be used to simultaneously detect various VOC gases via multi-frequency control, and the same wafer can include a plurality of FBAR devices respectively having various heights of the air gaps to decrease the manufacturing costs, which is both non-obvious and novel.

While the invention has been described in terms of what is presently considered to be the most practical and preferred embodiments, it is to be understood that the invention need not be limited to the disclosed embodiments. Therefore, it is intended to cover various modifications and similar configurations included within the spirit and scope of the appended claims, which are to be accorded with the broadest interpretation so as to encompass all such modifications and similar structures.

We claim:

1. A method for manufacturing a film bulk acoustic resonance device having a specific resonant frequency, comprising:

providing a substrate having a recess, wherein the recess has a height;

configuring a first insulating layer on the substrate, configuring a second insulating layer on the first insulating layer and configuring a first piezoelectric material layer on the second insulating layer;

causing the recess to form an air gap between the first insulating layer and the substrate;

configuring a lower electrode on the first piezoelectric material layer and configuring a second piezoelectric material layer between the lower electrode and an upper electrode;

obtaining a functional relation of a resonant frequency of the film bulk acoustic resonance device versus the height, wherein when the height increases in a first range, the functional relation is defined by a negative first slope, and when the height increases in a second range, the functional relation is defined by a positive second slope that is greater than an absolute value of the first slope; and determining a specific height of the recess which corresponds to the specific resonant frequency based on the functional relationship, and selecting the specific height to manufacture the film bulk acoustic resonance device, wherein the air gap is vacuumized, the height has a minimum of 1 μm, the height has a maximum of 5 μm, the first range is from 1 μm to 3 μm, the second range is from 3 μm to 5 μm, thicknesses of the first insulating layer, the second insulating layer, the first piezoelectric material layer, the upper electrode and the lower electrode are all 0.2 μm, and a thickness of the second piezoelectric material layer is 1 μm.

2. The method according to claim 1, wherein the substrate includes a silicon, the first insulating layer includes a silicon nitride, the second insulating layer includes a silicon dioxide, the upper electrode and the lower electrode include Mo, and the first piezoelectric material layer and the second piezoelectric material layer include aluminum nitride or lead zirconium titanate (PZT).

3. A method for manufacturing a film bulk acoustic resonance device having a specific resonant frequency, comprising:

providing a substrate having a recess having a height;

configuring a first insulating layer on the substrate, configuring a second insulating layer on the first insulating layer and configuring a first piezoelectric material layer on the second insulating layer;

causing the recess to form an air gap between the first insulating layer and the substrate;

configuring a lower electrode on the first piezoelectric material layer and configuring a second piezoelectric material layer between the lower electrode and an upper electrode;

causing the specific resonant frequency versus the height to have a first slope when the height increases in a first range, the functional relation is defined by a negative first slope; and causing the specific resonant frequency versus the height to have a second slope when the height increases in a second range, the functional relation is defined by a positive second range that is greater than an absolute value of the first slope, wherein the height has a minimum of 1 μm, the height has a maximum of 5 μm, the first range is from 1 μm to 3 μm, the second range is from 3 μm to 5 μm, thicknesses of the first insulating layer, the second insulating layer, the first piezoelectric material layer, the upper electrode and the lower electrode are all 0.2 μm, and a thickness of the second piezoelectric material layer is 1 μm.

4. The method according to claim 3, wherein the substrate includes a silicon, the first insulating layer includes a silicon nitride, the second insulating layer includes a silicon dioxide, the upper electrode and the lower electrode include Mo, and the first piezoelectric material layer and the second piezoelectric material layer include aluminum nitride or lead zirconium titanate (PZT).

5. The method according to claim 3, wherein the substrate, the first insulating layer, the second insulating layer, the first piezoelectric material layer, the lower electrode and the second piezoelectric material layer form a first cylinder, a first diameter of the first cylinder is 200 μm, the air gap forms a second cylinder, a second diameter of the second cylinder is 140 μm, the upper electrode forms a third cylinder, and a third diameter of the third cylinder is 100 μm.

6. The method according to claim 3, further comprising: depending on a specific height of the recess which corresponds to the specific resonant frequency, selecting a specific height to manufacture the film bulk acoustic resonance device, wherein when a first change of thickness of the air gap is increased from 1 μm to 3 μm, a first change of the specific resonant frequency is decreased by 24 KHz, and when a second change of thickness of the air gap is increased from 3 μm to 5 μm, a second change of the specific resonant frequency is increased by 0.418 MHz.

* * * * *